Figure 1:
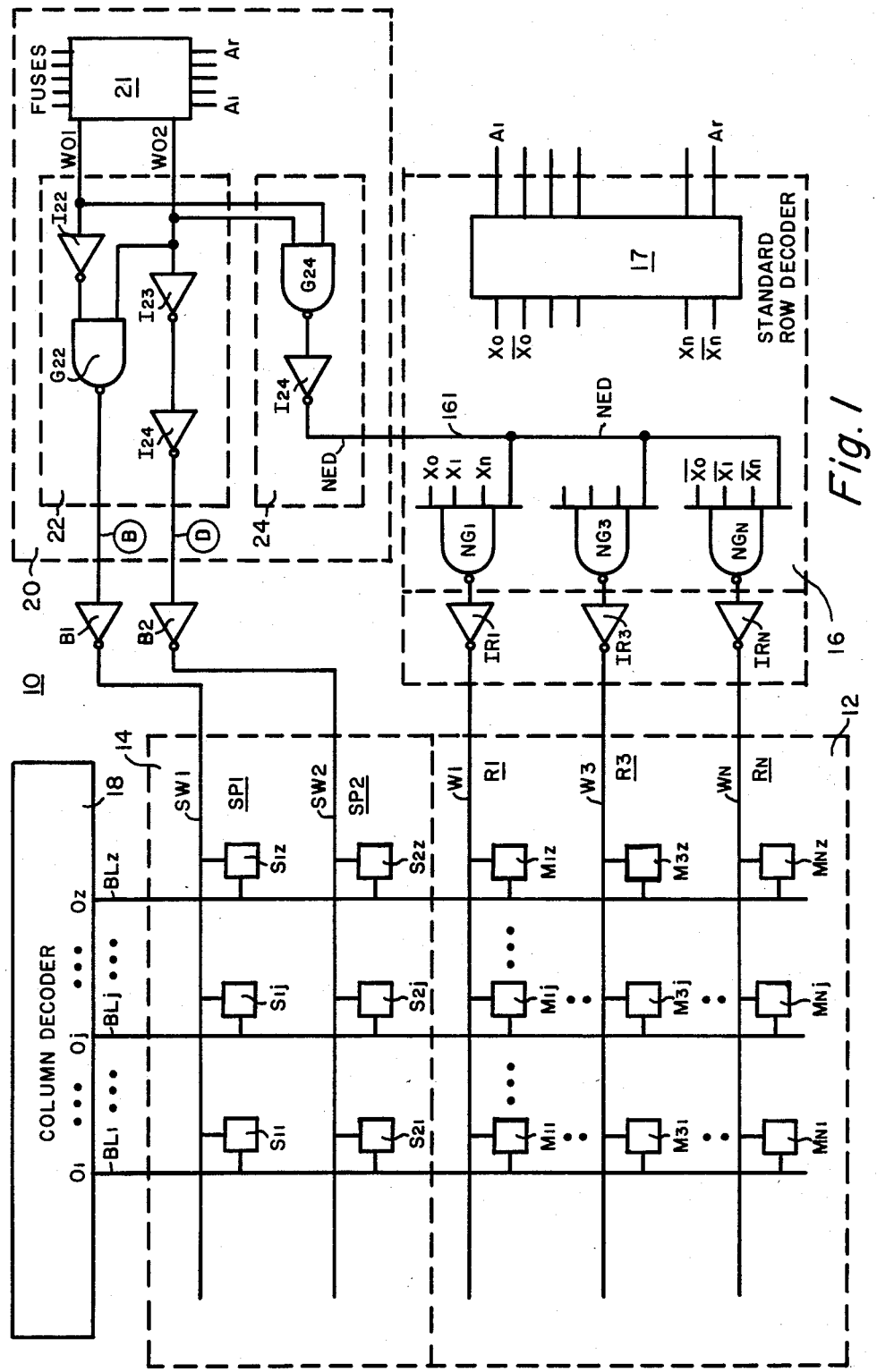

United States Patent [19]

Wacyk

[11] Patent Number: 4,639,897
[45] Date of Patent: Jan. 27, 1987

[54] PRIORITY ENCODED SPARE ELEMENT DECODER

[75] Inventor: Ihor T. Wacyk, Bridgewater Township, Somerville County, N.J.

[73] Assignee: RCA Corporation, Princeton, N.J.

[21] Appl. No.: 528,035

[22] Filed: Aug. 31, 1983

[51] Int. Cl.$^4$ ................................................ G11C 7/00
[52] U.S. Cl. .................................................... 365/200
[58] Field of Search .......................... 365/200; 371/10

[56] References Cited

PUBLICATIONS

IEEE Journal of Solid–State Circuits–vol. SC–16; No. 5, Oct. 1981; pp. 506–514.

*Primary Examiner*—James W. Moffitt
*Attorney, Agent, or Firm*—Joseph S. Tripoli; Henry I. Schanzer

[57] ABSTRACT

A fault tolerant memory system includes redundant rows which may be permanently substituted for defective rows according to priority. The system also includes means for substituting a redundant row for a defective redundant row previously connected in circuit.

6 Claims, 4 Drawing Figures

Fig. I

PRIORITY ENCODED SPARE ELEMENT DECODER

The Government has rights in this invention pursuant to Contract No. DAAK20-81-C-0411 awarded by Department of the Army.

This invention relates to semiconductor memories and, in particular, to memories manufactured with redundant cells to improve manufacturing yields.

Large scale integrated (LSI) circuits such as a 64K bit dynamic random access memory (RAM) or a 16K bit static RAM may consist of more than 100,000 active devices per Integrated Circuit (IC) or chip. It is difficult to fabricate such a large number of devices on a single IC without one or more defective devices. If such a large memory array is to be entirely free of defects to be acceptable, the yield in the manufacture of large memories formed on a single IC would be extremely low. To increase the yield, the prior art teaches the inclusion in a memory array, formed on a single chip, of redundant ("spare") columns of cells which can be substituted for columns containing defective cells. (The term columns is used by way of illustration. Redundant rows to replace defective rows or a combination of spare rows and columns to replace defective rows and columns could be used instead.) The substitution enables the manufacture of a memory array which is effectively free of defective cells at all its operative sites.

Some of the known memories manufactured with redundant columns of cells include means such as fusible links which are selectively blown for permanently removing defective columns and permanently substituting therefor redundant columns. A problem with the use of permanent disconnect-and-substitute means is that, if a spare column substituted for a defective column contains a defective element, there is no means for excising the defective spare column and substituting another spare column for it. Thus, for example, although an integrated circuit may have multiple spare columns, if a defect is present in the first spare substituted for a defective column, no benefit or use can be obtained from the remaining spares on the chip. The benefit of having multi spares to increase the effective yield is therefore limited.

Figure 2:
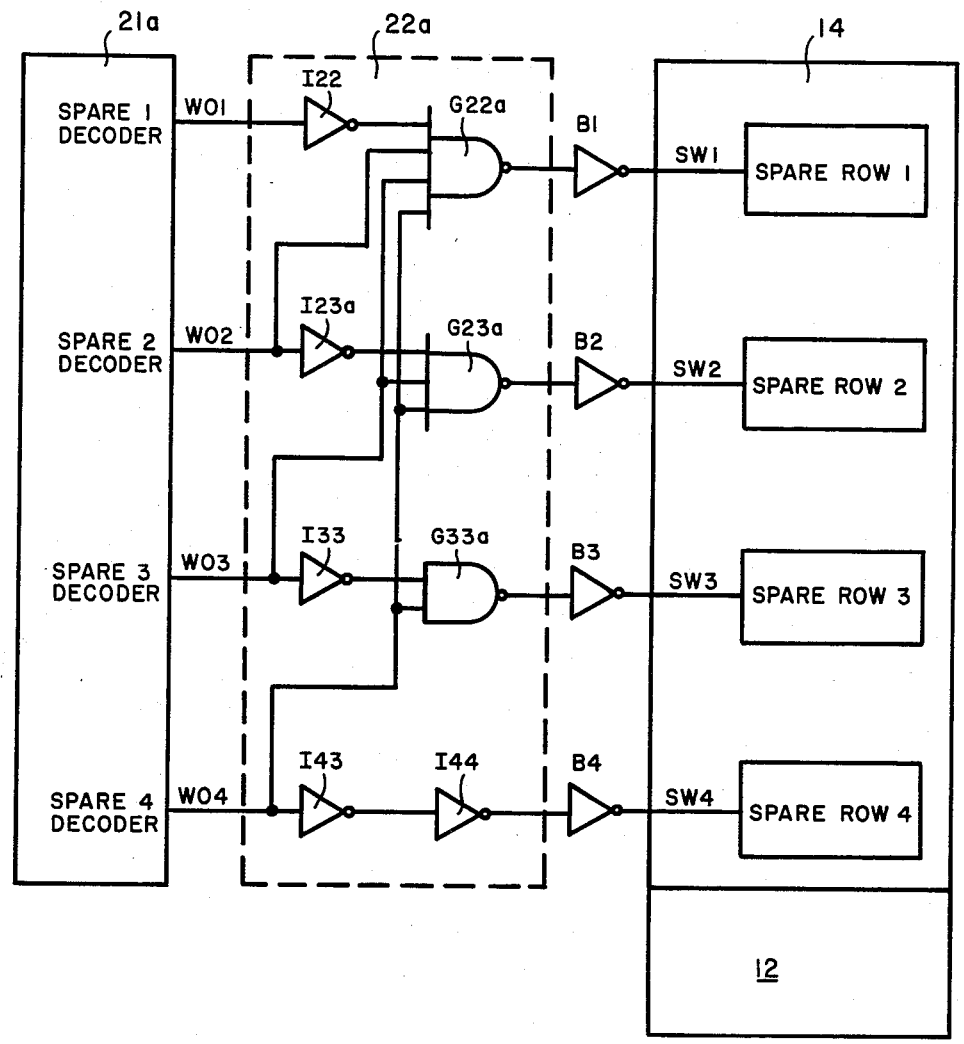
Figure 3:
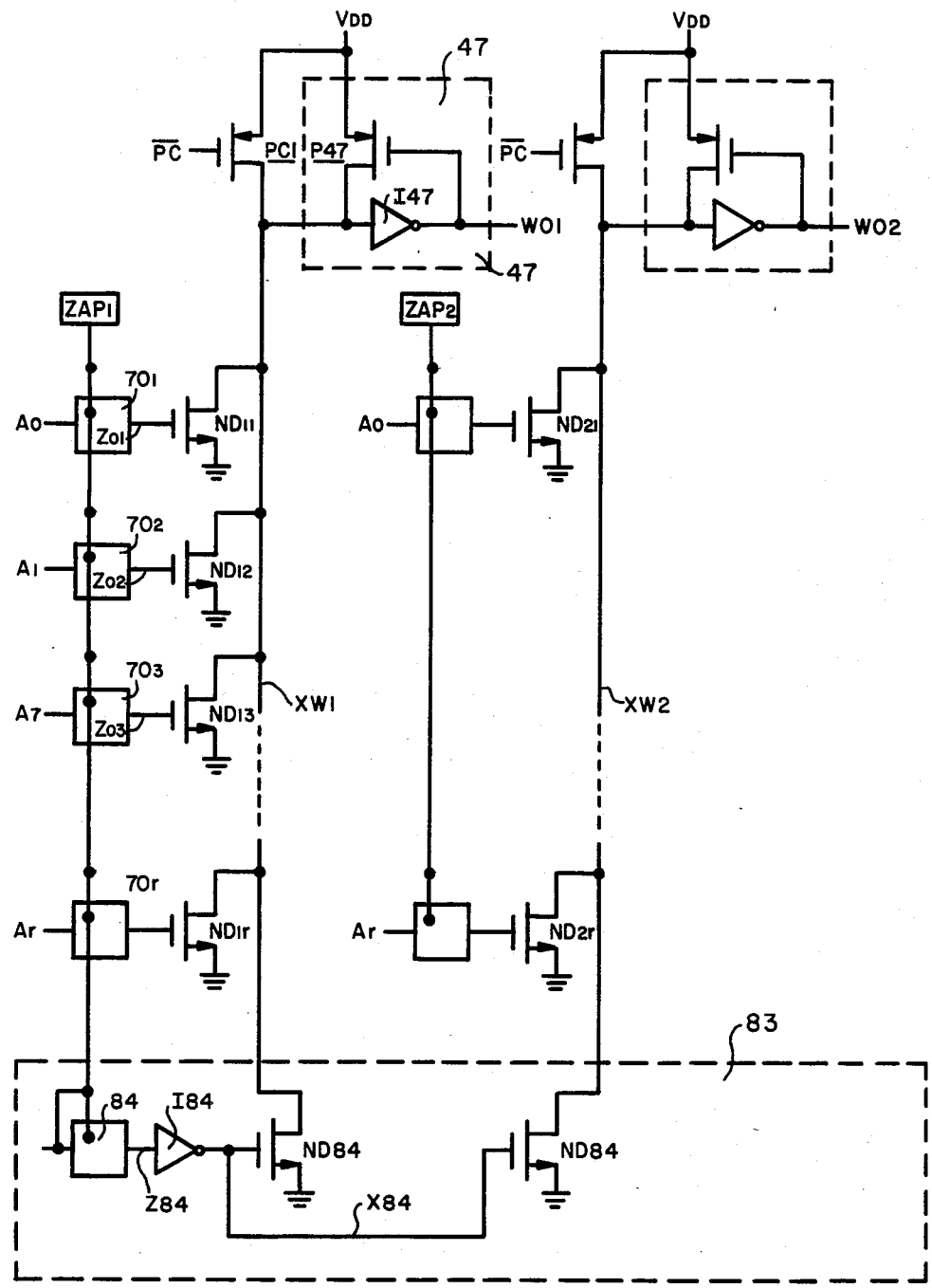
Figure 4:
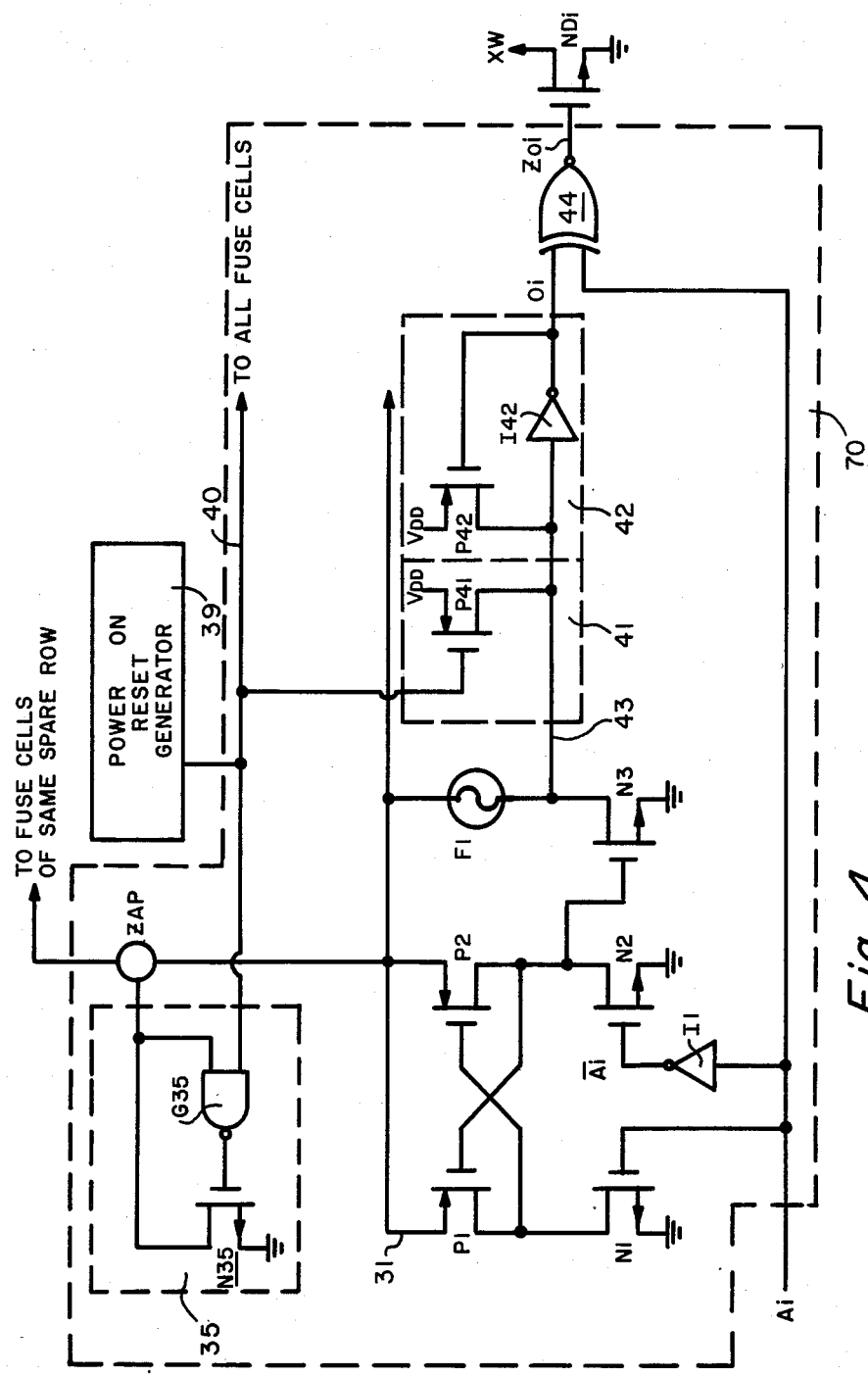

This problem is resolved in circuits embodying the invention by including means for substituting a spare row (and/or column) for a defective spare row (and/or column) in addition to means for substituting spare rows (and/or columns) for defective "standard" rows (and/or columns). In the accompanying drawing, like reference characters denote like components; and FIG. 1 is a diagram, partially in schematic and partially in block form, of a random access memory (RAM) circuit embodying the invention;

FIG. 2 is a logic diagram of a priority encoded decoder for use with a memory system embodying the invention;

FIG. 3 is a diagram, partially in schematic form and partially in block form of a comparator circuit suitable for use in the circuit of FIG. 1; and FIG. 4 is a diagram of a fuse cell suitable for use in the circuit of FIG. 1. In the discussion to follow, a signal at or near a potential of $V_{DD}$ volts is arbitrarily defined as a logic "one" or "high" condition while a signal at or near ground potential is arbitrarily defined as a logic "zero" or "low" condition.

The circuit of FIG. 1 includes an integrated circuit (IC) memory chip 10 comprised of: (1) a standard array 12 of memory cells, Mij, arranged in "i" rows and "j" columns where i and j are integers representing the order of the rows and columns, respectively; (2) a spare memory bank 14 comprised of two spare ("redundant") rows of memory cells, Sij; (3) a row decoder 16 whose outputs are coupled to and drive the row conductors (Wi) associated with array 12; (4) a column decoder 18 whose outputs are connected to the bit lines (BLj) of array 12 and spare bank 14; and (5) a spare row selector and substituter 20 for selectively substituting, in an ordered ("prioritized") sequence, a spare row for a defective standard row or for a lower priority order spare row.

Array 12 is shown as having "N" rows and "Z" columns of memory cells, Mij, which may be either dynamic or static. There is a row conductor (Wi) per row of cells and a column conductor (BLj) per column of cells. The row conductors function as the word lines while the column conductors function as the bit lines. Only a single column conductor is shown per column of cells but it should be understood that each column conductor shown could include two bit lines for carrying complementary information to, or from, a column of cells. Memory arrays of the type under consideration are known in the art and parts of arrays are shown, for example, in the following U.S. Pat. Nos. 4,156,940 and 4,189,782 (Array of 5 Transistor Static Memory Cells); 4,107,556 (Array of 1 Transistor Dynamic Memory Cells); and 3,714,638 (Array of 6 Transistor Static Memory Cells). The structure and operation of memory arrays shown in the cited references and others, are well known in the art and is incorporated herein by reference. The read and write operation of memory arrays is known and need not be greatly detailed. Suffice it to say that when an enabling signal is applied to a row conductor (Wi) all the cells (Mij) of that row are accessed ("addressed"). Information (a "high" or a "low") on a column conductor (BLj) can then be written into the cell (Mij) associated with that row and column or else information in an accessed ("addressed") cell can then be read out onto the column conductor (BLj) associated with the cell.

Redundant memory bank 14 includes two spare ("redundant") rows (SP1, SP2) of cells (Sij) having the same number of columns as the "standard" array, each spare cell Sij being, preferably, similar to the Mij cells of array 12. Each spare row is accessed by a corresponding row conductor (SW1, SW2) which functions as a word line.

The word lines (Wi) of array 12 are selectively enabled by means of word decoder 16 to which is applied "r" addresses (A1 through Ar). Decoder 16 may be any one of a number of known decoders which in response to "r" address inputs can produce up to N unique outputs, where N is equal to 2r. In Decoder 16, "N" NAND gates (NG1 through NGN) are used to combine the "r" address inputs and their complements to produce N unique outputs. Also, a normal element disable (NED) line 161 is connected to one input of each one of NAND gates NG1 through NGN to couple a disabling NED signal to NAND gates NG1 through NGN and effectively disable them and decoder 16 when a spare row is enabled. The N unique outputs, one output per row conductor of array 12, are connected via inverting buffers IR1 through IRN to their corresponding row (word line) conductors (Wi).

Column decoder 18 may also be any one of a number of known decoders responsive to a set of input signals (not shown). The outputs (Oj) of decoder 18 are connected to respective bit lines (BLj) of arrays 12 and 14, there being one output, Oj, and one bit line, BLj, per column of elements in arrays 12 and 14. Decoder 18 may be programmed, during a write cycle, to apply a "high" ($V_{DD}$ volts, or logic "1") to a selected one or ones of the bit lines or a "low" ($V_{DD}$ volts, or logic "0") to the remaining bit lines. Decoder 18 may also be programmed, during a read cycle, to sense a high or a low read out onto the bit lines from accessed memory cells.

Spare row selector 20 includes a comparator circuit 21, a spare row "prioritizing" decoder 22 and a standard element disabling circuit 24.

Comparator 21 is a programmable decoder having two outputs (WO1, WO2), one output for each spare row, and to which is applied address inputs A1 through Ar. Comparator 21 includes fuse cells of the type shown in FIG. 4 which may be programmed to produce "select" output signals (W01=low or WO2=low) at its outputs (WO1, WO2) in response to a preselected combination of address inputs. The comparator is programmable whereby an enabling signal condition (e.g. a "low" at WO1 or WO2) can be produced at its outputs corresponding to the address of a defective row for substituting a spare row for a defective row. By way of example, if during the course of testing array 12 a "standard" row is found to be defective (i.e. it contains one or more defective elements), comparator 21 is programmed to cause one of its available outputs (e.g. WO1) to go low corresponding to the address of the defective row whenever the latter is addressed. The spare row (e.g. SP1) corresponding to the programmed output (e.g. WO1) is then substituted for the defective row whenever the latter is addressed. If the substituted spare row (e.g. SP1) is then found to be defective comparator 21 is again programmed to cause another available output (e.g. WO2) to go low corresponding to the address of the defective row.

The two outputs WO1, WO2 of comparator 21 are applied to the two inputs of decoder 22 whose two outputs (B, D) are coupled via inverting buffers B1 and B2 to respective spare row conductors SW1 and SW2. Inverter I22 of decoder 22 is connected at its input to WO1 and at its output to one input of a two input NAND gate G22. The other input of G22 is connected to WO2 and the output (B) of G22 is connected to the input of buffer B1 whose output is connected to conductor SW1. WO2 is also connected to the input of inverter I23 whose output is connected to the input of I24 whose output (D) is applied to buffer B2 whose output is connected to row conductor SW2.

The operation of decoder 22 is such that spare row SP2 is assigned a higher priority than spare row SP1, whereby SP2 can be substituted for SP1, as outlined below: (a) When WO1 and WO2 are high (deselected) its two outputs (B and D) are high (disabled) and the two spare rows are deselected (SW1=SW2=low); (b) When WO1 is low (selected) and WO2 is high (deselected), B is drven low and D is driven high. SW1 is then driven high enabling SP1 while SW2 remains low disabling SP2. (c) When WO2 is low it disables output B (i.e. B is driven high) of decoder 22 while it enables output D of decoder 22 regardless of whether WO1 is high or low. Hence, whenever WO2 is low SW2 is driven high while SW1 is driven low. Thus whenever WO2 is enabled spare 2 is selected and Spare 1 is deselected.

Accordingly, decoder 22 is encoded to respond to its enabling inputs in accordance with a prearranged order of priority. Thus if WO1 and WO2 are both enabled, decoder 22 selects the spare row corresponding to WO2 which is of higher priority and deselects the spare row corresponding to WO1 which is of lower priority. Decoder 22 thus determines which spare row is selected when the two commands (WO1 and WO2) from comparator 21 are enabled at the same time. In the circuit of FIG. 1 spare row 1 (SP1) is arbitrarily assigned the first (lowest) priority and spare row 2 (SP2) is arbitrarily assigned the second (higher) priority. Obviously the priority order could have been reversed.

Disabling circuit 24 includes a two-input NAND gate G24 whose two inputs are coupled to WO1 and WO2 and whose output is connected to the input of Inverter I24 whose output (NED) is connected to one input of NAND gates NG1 through NGN. When either one or both of WO1 or WO2 is in a select condition (i.e. low) the output (NED) of network 24 is low inhibiting all the NGi gates. Network 24 thus functions to disable or deselect all the rows of array 12 whenever any spare row in bank 14 is selected.

The operation of the memory system is now discussed.

Following fabrication of the IC 10, the standard memory array 12 is tested by selectively enabling its row and column conductors. Assume that the testing is done in an ordered manner beginning with the first row (R1) and continuing through the Nth row (RN). If in the course of testing array 12 it is discovered that one of the elements in a row (e.g. row 3) of array 12 is defective, comparator 21 is programmed to cause WO1, which controls the selection of the first spare row, to be selected (i.e. go low) for the address (A1 through Ar) which selects row 3. Once WO1 is programmed to go low for the row 3 address it is thereafter always (i.e. permanently) driven to the low level whenever the address for row 3 is applied to the memory system. And, whenever WO1 goes low (with WO2 held high) decoder 22 causes spare row 1 to be selected and substituted for row 3. Whenever WO1 goes low (while WO2 is held high), the output of I22 goes high, and the two inputs to G22 are then high causing its output B to go low and the output of buffer B1 to go high. An enabling (high) signal is then applied to row conductor SW1 whereby the elements of the first spare row are addressed (selected). Concurrently, WO1 low causes the output of G24 to go high and the output (NED) of I24 to go low. NED-low functions to disable NAND gates NG1 through NGN preventing the selection of any of the rows in array 12. Thus, once comparator 21 is programmed the system substitutes spare row 1 for row 3 and disables the standard array whenever defective row 3 is addressed.

After, the spare row (e.g. SP1) is substituted for a defective standard row (e.g. row 3) the spare row is tested to determine whether all its cells are functional. If in the course of testing the first spare row, it is found that one or more of its elements are defective, SP2 is substituted for SP1. The substitution of SP2 for SP1 is achieved by programming comparator 21 such that WO2 is selected (i.e. WO2 is set low) for the same input address for which WO1 is selected. Comparator 21 is of the type which permanently stores a programmed condition. Thus, when the first spare row is defective and the second spare row is subsequently selected, WO1 and WO2 are both driven low for the same input address.

However, when WO1 and WO2 are both low (i.e. selected), the priority decoder 22 functions to enable only the higher priority input (e.g. WO2) signal line while it disables or inhibits the selection of the lower priority spare row 1 (e.g. SP1) corresponding to the lower priority input (e.g. WO1). WO2-low causes output B of G22 to be held high and the SW1 signal to be low thereby deselecting SP1. Concurrently WO2-low causes output D of I24 to go low and the output of B2 to go high thereby enabling the second spare row SP2. Therefore, the higher priority spare row 2 is substituted for the lower priority spare row 1 whenever the second spare is selected (i.e. WO2-low). Thus, spare row 2 is substituted for spare row 1 and spare row 1 is disabled when WO1 and WO2 are both "selected" for the same input address.

If after the substitution of SP1 for the first defective row of array 12 it is found that all the elements of SP1 are "good", the testing of array 12 continues until a next defective row of array 12 is found. Thus, if the first spare row is fully operative, the second spare row is substituted for another defective row of array 12. When the next defective row (e.g. row N) is found, comparator 21 is programmed to produce a low at WO2 for the address corresponding to that row. When WO2 goes low, regardless of the state of WO1, a high is produced at the output of B2 which enables SP2. Concurrently, WO2 low disables SP1 and all the NAND gates NG1 through NGN. Thus, when WO2 is selected and enables SP2 the spare row (i.e. SP1) of lower priority is disabled. "Prioritizing" decoder 22 thus bars two spare rows from being enabled at the same time. This prevents interaction between a defective and a good row or even between two good rows.

In the circuit of FIG. 1, only two spare rows were shown, for ease of illustration. However, as shown in FIG. 2, the invention may be readily adapted to memory systems employing more than two spare rows. FIG. 2 includes a comparator 21a and a "priority" decoder 22a suitable for use with a memory system having four spare rows. Comparator 21a has four outputs (WO1 through WO4), one output per spare row. WO1 through WO4 function as the four inputs to decoder 22a which has 4 outputs, one output per spare row. Decoder 22a is organized to assign the lowest priority to spare row 1, the next higher priority to spare row 2, the still next higher priority to spare 3 and the highest priority to spare row 4. The operation of the decoder circuit 22a is similar to circuit 22 of FIG. 1 and does not need to be greatly detailed.

If there are no defective rows in array 12, outputs WO1 through WO4 of comparator 21a are held "high" for all address inputs. This condition causes all the SWi signals to be held low whereby none of the spare rows are ever selected. If a defective row is found comparator 21a is programmed to produce an output which functions to substitute a spare row for that defective standard row. Where all the spare rows are fully operative, each spare row can be substituted for a different defective standard row of array 12; each spare being enabled for a different address. When all the spares are "good", only one of the WOi outputs of comparator 21a will be programmed low at any one time corresponding to a particular address input.

When all the spare rows are "good" the order in which the spares are substituted for the defective rows is not critical since each spare row is substituted for different defective rows of array 12 by programming comparator 21a. Typically, the first spare row is substituted for the first row of array 12 found to be defective, the second spare row is used to substitute for the second row found to be defective, the third spare is used to substitute for the third row found to be defective, so on and so forth.

However, when a spare row is defective comparator 21a is programmed to produce an enabling output at more than one of its WOi outputs at the same time in response to the same address. Decoder 22a then functions to enable only the one spare row assigned the highest priority.

The response of decoder 22a to the WOi signals produced by comparator 21a is outlined below. The particular WOi signal set low (i.e. enabled) [with all other WO signals set high (i.e. disabled) ] causes the corresponding SWi output to be enabled (set high) energizing the corresponding spare row. Furthermore, as for decoder 22 of FIG. 1, an enabling WOi signal disables any SW outputs of lower priority. Thus when WO2 goes low (with WO3=WO4=high) it causes the output of G22a to go high regardless of the value of WO1. Thus when WO2 is selected the output of B1 goes low deselecting spare row 1. Similarly, when WO3 goes low (with WO4=high) it causes the output of G22a and G23a to go high and the outputs of B1 and B2 to go low regardless of the values of WO1 and WO2. Thus when WO3 is selected spare row 3 is selected and spares 1 and 2 are deselected. Finally, when WO4 goes low it causes the output of G22a, G23a and G33a to go high and the outputs of B1, B2 and B3 to go low regardless of the values of WO1, WO2 and WO3. Thus, when spare row 4 is selected the other spares are deselected. This feature enables the substitution of a spare row of higher priority for a defective spare of lower priority. By way of example, assume that the first spare row is defective, then, and in that event, comparator 21a is programmed to produce a low output at WO2 for the same input address causing WO1 to be low. However when WO1 and WO2 are both low, WO2 controls and decoder 22a enables row conductor SW2 while disabling row conductor SW1 corresponding to WO1. In a like manner, if the first and second spare rows are found to be defective, comparator 21a is programmed to produce a low at WO3 for the same input address which causes WO1 and WO2 to go low. WO3-low now controls and decoder 22a disables the lower priority row conductors (SW1 and SW2) corresponding to WO1 and WO2 while enabling row conductor SW3. Similarly when WO4 goes low decoder 22a enables SW4 and inhibits all the other lower priority outputs. By this means any spare row of higher order ("priority") can be substituted for a lower order spare or for a defective "standard" row.

FIG. 3 details parts of a comparator, such as comparator 21 of FIG. 1, suitable for use in a memory system embodying the invention. The comparator includes one set of fusible cells 70 per output line (WO1, WO2), each set including one fusible cell per address bit ("inputs"). Outputs WO1, WO2 in FIG. 3 correspond to the like numbered outputs in FIG. 1. The comparator circuitry associated with one spare row is similar to that for any other. Accordingly only the circuitry used to produce WO1 is discussed in detail.

Each one of "r" address bits (A1–Ar) is connected to a different one of "r" fuse cells (701 through 70r). As detailed below, the fuse cells may be programmed by means of a ZAP line (e.g. ZAP1) common to the fuse cells of that line to produce an "error" indication at the fuse cell output (ZOi). In this design an "error" indication is a "low" level signal at the output of a fuse cell (i.e. ZOi=low). The output (ZOi) of each fuse cell is connected to the gate electrode of a corresponding grounded source decoding transistor (ND1i) whose drain is connected to the XW1 line. The ND1i transistors function as a decoding NOR gate.

An inverting half latch circuit 47 is connected between line XW1 and the corresponding comparator output WO1. Circuit 47 includes an inverter I47 connected at its input to line XW1 and at its output to WO1. The output of I47 is also connected to the gate electrode of a transistor P47 whose conduction path is connected between $V_{DD}$ and line XW1. P47 functions to latch XW1 to the high level when WO1 is driven low. The conduction path of a precharge transistor PC1 is connected between $V_{DD}$ and line XW1 to selectively precharge line XW1 to $V_{DD}$ volts.

The operation of the comparator is briefly as follows. Concurrently with the application of a (new) set of address bits (A1 through Ar) to the fuse cells a negative going precharge pulse ($\overline{PC}$) is applied to PC1 precharging line XW1 to $V_{DD}$ volts. When all of the fuse cell outputs, ZO1 through ZOr, are "low", indicative of an error output for each address bit, all of the ND1i transistors are turned-off. If all the NDi transistors are turned-off, line XW1 remains charged to $V_{DD}$ volts causing WO1 to be held low. WO1-low causes the turn-on of P47 latching XW1 to the high level even after the $\overline{PC}$ pulse returns to $V_{DD}$ volts and turns-off PC1.

If any fuse cell output (ZOi) is high (indicating that no error exists for its corresponding address bit), then one of the ND1i transistors is turned on and line XW1 is pulled to ground. Whenever XW1 is grounded the WO1 output is driven or held high. Thus, whenever every bit of an input address matches every bit of the address (of a defective row) programmed into the fuse cells 701 through 70r, the WO1 output goes low and the spare row is selected and substituted for the row whose address is programmed into the fuse cells.

FIG. 4 is a partial schematic partial block diagram of a typical fuse cell 70 which may be programmed to produce a fault indication for a particular address bit. [An address bit (Ai) and a ZAP line (ZAP) are applied to each fuse cell.] The fuse cell includes 2 cross-coupled level-shifting inverters. One inverter, comprised of transistors P1 and N1, is driven by an address bit Ai and the other inverter, comprised of transistors P2 and N2, is driven by the complement of the address input $\overline{Ai}$. The source electrodes of P1 and P2 are connected to a switchable power line 31 connected to the ZAP line and the source electrodes of N1 and N2 are connected to ground. The gate electrode of P2 is connected to the drains of P1 and N1 while the gate electrode of P1 is connected to the drains of P2 and N2. Ai is applied to the gate of N1 and to the input of an inverter I1 whose output, at which is produced $\overline{Ai}$, is connected to the gate electrode of N2. The drains of P2 and N2 are also connected to the gate electrode of a transistor N3 whose source is grounded and whose drain is connected to one end of a fuse F1 whose other end is returned to line 31. The voltage ($V_{ZAP}$) applied to the ZAP line is normally low or ground. When a fusible cell is to be programmed, the ZAP line voltage is raised to 10 volts or more. A half-latch circuit 35, comprised of a two-input NAND gate G35 and a transistor N35, functions to maintain the ZAP line grounded when $V_{ZAP}$ is low or when a power-on reset generator 39 applies a low signal to a line 40 connected to one input of G35.

The state of the fuse is sensed by means of a precharge circuit 41 and a half latch circuit 42. Precharge circuit 41 includes a transistor P41 whose source-to-drain path is connected between $V_{DD}$ and a line 43 which is connected to the drain of N3. Half-latch 42 includes an inverter I42 connected at its input to the drain of N3 and at its output, which defines the output Oi, to the gate of a transistor P42. The source drain path of P42 is connected between $V_{DD}$ and line 43 and functions to hold line 43 high whenever Oi goes low.

The address bit Ai and the output Oi of inverter I42 are applied to the two-inputs of a two-input exclusive NOR gate 44 whose output ZOi is applied to the gate electrode of a decoding transistor NDi.

To program an error condition into a fuse cell the ZAP line voltage is raised from the normally ground (low) level to $V_{ZAP}$ (e.g. 10 volts=high). When $V_{ZAP}$ is high the power-on reset generator 39 output is also high whereby the clamping circuit 35 is disabled, (i.e. N35 is turned-off removing the clamp between the ZAP line and ground.) The operation of the fuse cell is now examined for the condition when $V_{ZAP}$ is high and the address input is either high or low. When $V_{ZAP}$ is high and Ai is high, $\overline{Ai}$ (produced at the output of I1) is low whereby N2 and P1 are turned-off, while N1 is turned-on turning-on P2. $V_{ZAP}$-high is then coupled via the source-drain path of P2 to the gate of N3 turning-on N3 and clamping its drain to ground. This effectively grounds one side of the fuse. In the meantime, $V_{ZAP}$-high is applied to the other side of the fuse connected to line 31. Since the full ZAP voltage is applied across the fuse, the fuse is blown. Therefore, when $V_{ZAP}$ is high, indicative of an error condition, fuse F1 is blown if Ai is high.

When $V_{ZAP}$ is high and Ai is low, with $\overline{Ai}$ high, N1 and P2 are turned-off, while N2 and P1 are turned-on ensuring the turn-off of N3 and P2. With N3 turned-off, the end of fuse F1 connected to the drain of N3 as well as the other end of the F1 fuse connected to line 31 are at, or close to, $V_{ZAP}$ high. Since there is little, if any, voltage differential across the fuse, fuse F1 remains in its unblown state. After the fuse cell is programmed the ZAP voltage is returned to the low voltage (ground) condition and is held low by latch 35.

When the memory array is operated in circuit, the power-on reset generator 39 generates a negative pulse whenever an address input to the circuit changes state. The negative pulse ensures that latch 35 grounds the ZAP line and line 31. Concurrently the negative pulse turns-on P41 precharging line 43 to $V_{DD}$ volts. The circuit response is now examined for the condition where F1 is either blown or unblown and Ai is high or low. When F1 is blown, there is no direct connection between the drain of N3 and line 31. When $\overline{Ai}$ is high, $\overline{Ai}$ is low, N1 and P2 are turned-on while P1 and N2 are turned-off. But, recall that line 31 is now held at ground potential. Hence, the gate of N3 is at, or close to, ground and N3 remains (or is held) in a non-conductive state. Accordingly line 43 precharged to $V_{DD}$ volts remains high. Likewise, if Ai is low, and $\overline{Ai}$ is high, N2 is turned-on holding N3 turned off. Line 43 precharged to $V_{DD}$ volts by means of the power-on preset pulse remains precharged at $V_{DD}$ volts The high on line 43 is inverted by I42 causing a low to be applied to the gate of P42 latching line 43 to $V_{DD}$ volts and the output Oi at a low level. Thus, if F1 is blown regardless of the value of the Ai input, line 43 is going to be high and the output Oi is going to be low.

On the other hand, if F1 is unblown it provides a low impedance conduction path between line 43 and terminal 31 which is now held at ground. Line 43 is then grounded via the fuse regardless of the value of Ai. The output of inverter I42 then goes high holding P42 turned-off, and line 43 is held at, or close to, ground even after the precharge pulse disappears.

Thus, as tabulated in Table 1 below, regardless of whether Ai is high or low, if F1 is blown Oi is low and if F1 is unblown Oi is high. The output Oi thus indicates the status of the fuse (i.e. whether blown or unblown). The Oi output and the Ai input are applied to exclusive-NOR gate 44 whose output ZOi indicates whether a fault or "error" condition exists. ZOi is driven low (shows an error) for two signal conditions also tabulated in Table 1.

When F1 is blown (Oi is low) and Ai is high an error indication is produced for that address bit condition. Also when F1 is unblown (Oi is high), and Ai is low an error indication is produced for that address bit condition.

When Oi is low and Ai is low, ZOi is high indicating that this cannot be a fault indication. Likewise when Oi is high and Ai is high, ZOi is high indicating that this cannot be an error indication.

TABLE 1

| F1 | Oi | Ai | ZOi |
|---|---|---|---|
| BLOWN | Lo | Hi | Lo error ind. |
|  |  | Lo | Hi |
| UNBLOWN | Hi | Hi | Hi |
|  |  | Lo | Lo error ind. |

The fault condition (ZOi-low) produced when the fuse is unblown (Oi-high) and Ai is low is a true error indication only when it is known that the ZAP line has been programmed high. Thus, an error indication for Ai low (and F1 unblown) is not necessarily valid unless the ZAP line has been programmed high.

Referring back to FIG. 3, in the absence of the circuit in block 83, if all the address inputs (Ao through Ar) were low, and all the fuses were unblown all the Zoi outputs would be low resulting in the corresponding XWi line being held high and the corresponding WO output being driven low. This would result in the substitution of a spare row for the standard row corresponding to the all zero address, even if the standard row corresponding to the all zero address was good. This situation is avoided by the inclusion of circuitry in block 83 of FIG. 3 to record whether the ZAP line had been programmed high. The circuitry in block 83 includes a fuse cell 84 which may be of the same type as the comparator cell 70 detailed in FIG. 4. The address input to cell 84 is connected to the ZAP line, and the output (Z84) of the cell is applied to an inverter I84 whose output (X84) is applied to the gate electrodes of transistor ND84 connected in parallel with the decoding NDi transistors.

As detailed below, if the ZAP line was never programmed (i.e. never raised to high voltage-indicating that all the standard rows are good) then transistors ND84 are turned-on whenever the memory is operated clamping the XW lines to ground and the WO outputs to $V_{DD}$ volts.

If the ZAP 1 line was never programmed high then the fuse in cell 84 is unblown and O84 in cell 84 is high whenever the memory system is operated. Furthermore since the address input line is connected to the ZAP 1 line, the address input is low whenever the memory system is operated. Consequently the output Z84 of cell 84 is low and X84 is high grounding the XW lines and holding all the WOi outputs high. When all the WOi outputs of the comparator are high no spare row is selected. Hence, the block 83 circuitry prevents the automatic substitution of a spare row for the standard row corresponding to the "all zero" address if that standard row is not defective. Once the ZAP 1 line has been programmed (i.e. raised high) the fuse in cell 84 is blown. Once the fuse in cell 84 is blown Z84 is always driven high (since the address input to cell 84 is grounded) and X84 is driven low when the memory system is operated. X84-low turns-off the ND84 transistors and allows the XW lines to be driven high and the WO lines to be driven low (enabled). The WO1 comparator output for the "all zero" address would then be an accurate reflection of the memory system condition.

In the circuit of FIG. 4 a Power-on Reset Generator 39 is used to latch the fuse data to avoid static drain through P41 and is an important power saving feature.

In the circuits of FIGS. 1 and 2 reference is made to the substitution of spare rows for defective rows. It should be understood however that the term "rows" is used by way of example only and that columns could have been used instead. Furthermore, the invention is equally applicable to systems in which spare rows and spare columns are substituted for defective rows and defective columns.

Comparator 21 and decoder 22 have been used to illustrate the invention. It should be evident that many different types of comparators and decoders could be used to practice the invention.

The invention was illustrated using random access memories (RAMs). It should be evident that the invention may also be used with read-only-memories (ROMs).

What is claimed is:

1. In a memory array formed on a semiconductor chip comprising memory cells arranged in rows and columns, some of the rows being standard rows and N of the rows being initially spares to be substituted for standard rows which include defective cells, where N is an integer equal to or greater than 2; the improvement comprising:

means for selectively substituting any one of said N spare rows for any one of said standard rows including means for encoding the spare rows in a predetermined order of priority and selectively substituting a spare row of higher priority for a spare row of lower priority.

2. In a memory array formed on a semiconductor chip comprising memory cells arranged in rows and columns, some of the rows being standard rows and N of the rows being initially spares to be substituted for standard rows which include defective cells, where N is an integer equal to or greater than 2; the improvement comprising:

permanently programmable means for selectively substituting any one of said N spare rows for any one of said standard rows including means encoding the spare rows in a predetermined order of priority for selectively substituting a spare row of higher priority for a defective spare row of lower priority.

3. The improvement as claimed in claim 2, wherein said means encoding the spare rows includes N inputs and N outputs, each input corresponding to an output, and each output corresponding to a different one of said N spare rows; said means encoding the spare rows including means arranging its N inputs in an order of priority from 1 to N for enabling only the one of its outputs at any one time corresponding to the highest priority input to which an enabled signal is applied.

4. The improvement as claimed in claim 3 wherein said permanently programmable means is responsive to incoming addresses and includes permanently programmed means for applying enabling signals to selected ones of said N inputs of said encoding means whenever an incoming address matches a previously programmed address.

5. A monolithic integrated circuit comprising:
   a standard memory array of cells arranged in rows and columns, with a row conductor per row of cells and a column conductor per column of cells;
   a row decoder and a column decoder;
   means coupling the row decoder to the row conductors;
   means coupling the column decoder to the column conductors;
   N spare rows of cells each spare row having the same number of columns as said standard array; where N is an integer equal to or greater than 2;
   a spare row programmable means having N outputs, one output per spare row, said programmable means being responsive to incoming addresses and being selectively programmed to produce enabling signals at preselected outputs whenever the incoming address matches a previously programmed address;
   encoded decoder means having N inputs, each input being connected to a different one of the N outputs of said programmable means, and having N outputs one output per spare row; said decoder means including means for encoding its N inputs in an order of priority from 1 to N for enabling only that one of its N outputs corresponding to its enabled input having the highest priority; and
   means for coupling each one of said N decoder means outputs to a different one of said N spare rows.

6. The combination as claimed in claim 5 wherein said programmable means includes fusible links for permanently storing the programmed addresses.

* * * * *